(12) United States Patent
Yin

(10) Patent No.: US 8,876,461 B2
(45) Date of Patent: Nov. 4, 2014

(54) SERIES FAN ASSEMBLING STRUCTURE

(75) Inventor: Guan-Chen Yin, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 440 days.

(21) Appl. No.: 13/299,634

(22) Filed: Nov. 18, 2011

(65) Prior Publication Data
US 2013/0126698 A1 May 23, 2013

(51) Int. Cl.
| F04D 29/52 | (2006.01) |
| F04D 19/00 | (2006.01) |
| F04D 25/06 | (2006.01) |
| F04D 29/64 | (2006.01) |
| G06F 1/20 | (2006.01) |
| H05K 7/20 | (2006.01) |
| H01L 23/40 | (2006.01) |
| H01L 23/467 | (2006.01) |

(52) U.S. Cl.
CPC ................ *G06F 1/20* (2013.01); *F04D 19/007* (2013.01); *H05K 2007/2009* (2013.01); *H01L 23/4006* (2013.01); *H01L 23/467* (2013.01); *F04D 25/0613* (2013.01); *F04D 29/646* (2013.01)

USPC .............................................. 415/68; 416/124

(58) Field of Classification Search
CPC .... F04D 17/162; F04D 19/007; F04D 29/646
USPC ......... 416/120, 124, 125, 128, 198 R, 198 A; 415/60, 66, 68
See application file for complete search history.

(56) References Cited

U.S. PATENT DOCUMENTS 7,585,150 B2 * 9/2009 Hsu et al. .......................... 415/66

FOREIGN PATENT DOCUMENTS

TW 481434 U 3/2002

* cited by examiner

*Primary Examiner* — Richard Edgar

(57) ABSTRACT

A series fan assembling structure includes a first main body and a second main body. A first reception recess, a first engagement body, a first reception section and a second reception section are respectively disposed in four corners of one end of the first main body. A second reception recess, a second engagement body, a first raised body and a second raised body are respectively disposed in four corners of one end of the second main body. The first and second engagement bodies and the first and second raised bodies are respectively correspondingly latched and engaged with the first and second reception recesses and the first and second reception sections, whereby the series fan can be quickly assembled and the shake can be minimized.

7 Claims, 4 Drawing Sheets

SERIES FAN ASSEMBLING STRUCTURE

BACKGROUND OF THE INVENTION

1. Field of the Invention

The present invention relates generally to a series fan assembling structure, which is able to quickly connect and locate a series fan by means of engagement and insertion structures and avoid shake.

2. Description of the Related Art

Following the advance of sciences and technologies, people have more and more relied on various electronic devices. It is known that in operation, the internal components of an electronic product (such as computer and laptop) will generate high heat. In case the heat is not conducted to outer side of the electronic product, the temperature will rise to cause overheating of the electronic product. Therefore, in general, a cooling fan is disposed in the electronic product for keeping the electronic product working at an operation temperature within a certain range. However, in some cases, one single cooling fan can hardly provide sufficient wind power. Therefore, two or more cooling fans are often serially connected with each other to provide sufficient wind power for dissipating the heat.

Taiwanese Utility Patent Publication No. 481434 discloses a cooling device for central processing unit. The cooling device includes radiating fins and at least two fans. The cooling device is characterized in that the first and second fans are serially mated with each other. Several connection pillars are connected between the first and second fans to space the two fans by a certain distance. When the radiating fins absorb the high heat of the central processing unit, the series fan provides increased wind power for enhancing and speeding the cooling effect.

The four corners of the frames of the first and second fans are formed with perforations. Screws can be passed through the perforations to serially connect the two fans and lock the two fans on the radiating fins.

In practice, some problems existing in such series fan structure, which is assembled simply by means of screws. First, the locking points of the screws are positioned on one side of one of the fans rather than on the connection face between the two fans. Under such circumstance, the connection force is insufficient and thus the connection face is incomplete. As a result, the two fans can be hardly fully connected with each other. Accordingly, in operation, the two fans are likely to collide and abrade each other to make noise and cause shake. Moreover, the airflow will escape through the gap of the connection face to deteriorate the wind power applied to the heat sink. Consequently, the heat dissipation efficiency is lowered.

In another type of conventional series fan structure, one of the serially connected fans is formed with multiple perforations in four corners, while the other fan is formed with at least one protrusion body corresponding to each perforation. The protrusions are inserted in the perforations to fixedly serially connect the two fans. The two fans can be fixedly serially connected with each other in such a manner. However, the two fans still can be hardly tightly connected with each other. As a result, in operation, the fans will shake and make noise.

According to the above, the conventional series fan structure has the following shortcomings:
1. The fans can be hardly tightly connected with each other.
2. In operation, the fans will shake and make noise.
3. The fans cannot be conveniently assembled.

SUMMARY OF THE INVENTION

A primary object of the present invention is to provide a series fan assembling structure, which is able to quickly assemble and locate a series fan.

To achieve the above and other objects, the series fan assembling structure of the present invention includes a first main body and a second main body.

The first main body has a first open end, a second open end and a first flow way in communication with the first and second open ends. In four corners of the second open end are respectively disposed a first reception recess, a first engagement body, a first reception section and a second reception section.

The second main body has a third open end, a fourth open end and a second flow way in communication with the third and fourth open ends. In four corners of the fourth open end are respectively disposed a second reception recess, a second engagement body, a first raised body and a second raised body. The first and second engagement bodies and the first and second raised bodies are respectively correspondingly latched and engaged with the first and second reception recesses and the first and second reception sections.

According to the above arrangement, the series fan can be quickly assembled and located without using any additional fastening member. Moreover, the fans can be more tightly connected with each other, whereby the series fan can operate without causing shake or making noise. Therefore, the lifetime of the series fan is prolonged.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
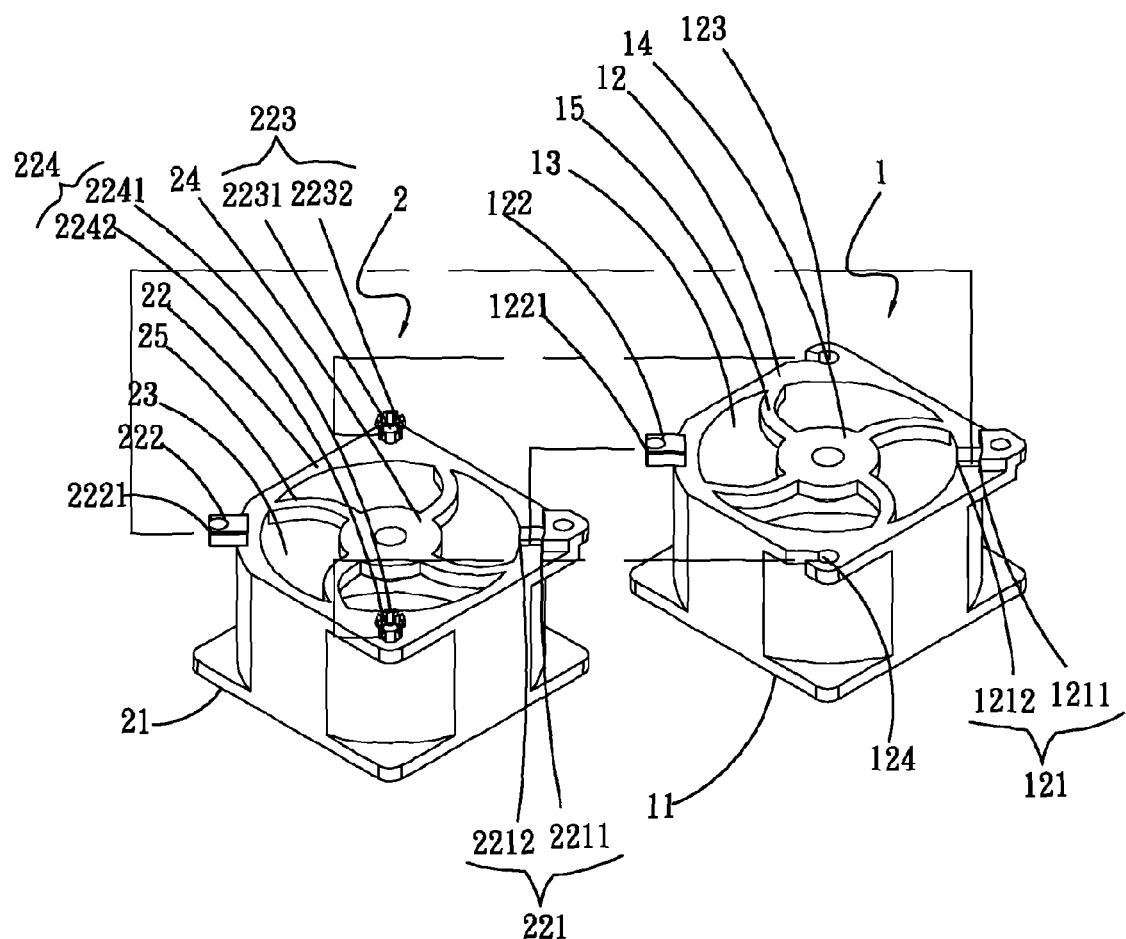
FIG. 1 is a perspective exploded view of a first embodiment of the series fan assembling structure of the present invention.
Figure 2:
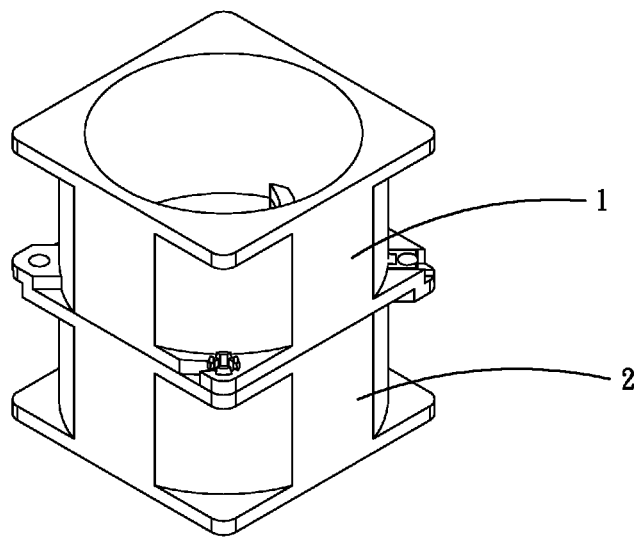
FIG. 2 is a perspective assembled view of the first embodiment of the series fan assembling structure of the present invention.

Please refer to FIGS. 1 and 2. FIG. 1 is a perspective exploded view of a first embodiment of the series fan assembling structure of the present invention. FIG. 2 is a perspective assembled view of the first embodiment of the series fan assembling structure of the present invention. The series fan assembling structure includes a first main body 1 and a second main body 2.

The first main body 1 has a first open end 11, a second open end 12 and a first flow way 13 in communication with the first and second open ends 11, 12. In four corners of the second open end 12 are respectively disposed a first reception recess 121, a first engagement body 122, a first reception section 123 and a second reception section 124.

The second main body 2 has a third open end 21, a fourth open end 22 and a second flow way 23 in communication with the third and fourth open ends 21, 22. In four corners of the fourth open end 22 are respectively disposed a second reception recess 221, a second engagement body 222, a first raised body 223 and a second raised body 224. The first and second engagement bodies 122, 222 and the first and second raised bodies 223, 224 are respectively correspondingly latched and engaged with the first and second reception recesses 121, 221 and the first and second reception sections 123, 124.

The second open end 12 has a first bushing seat 14 and multiple connection bodies 15. Two ends of the connection bodies 15 are respectively connected to the second open end 12 and the first bushing seat 14. The fourth open end 22 has a second bushing seat 24 and multiple connection bodies 25. Two ends of the connection bodies 25 are respectively connected to the fourth open end 22 and the second bushing seat 24. One end of the first bushing seat 14 is mated with the second bushing seat 24.

The first reception recess 121 has a first open side 1211 and a first closed side 1212. The second reception recess 221 has a second open side 2211 and a second closed side 2212. The first engagement body 122 has a first engagement end 1221. The second engagement body 222 has a second engagement end 2221. The first and second engagement ends 1221, 2221 abut against the first and second open sides 1211, 2211 respectively.

The first raised body 223 has a first protrusion end 2231 and a first socket 2232 axially recessed on the first protrusion end 2231. The second raised body 224 has a second protrusion end 2241 and a second socket 2242 axially recessed on the second protrusion end 2241. The first and second raised bodies 223, 224 extend from the fourth open end 22 in a direction away from the fourth open end 22. The first and second flow ways communicate with each other.

In this embodiment, when the first and second main bodies 1, 2 are assembled with each other, the second engagement body 222 and second reception recess 221 of the second main body 2 are aimed at the first reception recess 121 and first engagement body 122 of the first main body 1. Then the first and second engagement bodies 122, 222 are respectively correspondingly inserted into the second and first reception recesses 221, 121. Then the first and second raised bodies 223, 224 of the second main body 2 are respectively correspondingly latched with the first and second reception sections 123, 124 of the first main body 1.

Figure 3:
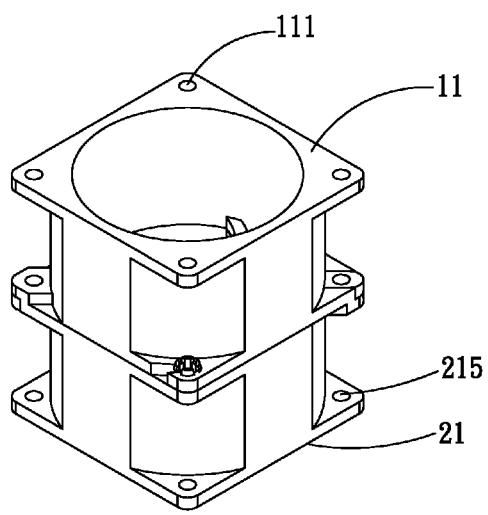
FIG. 3 is a perspective assembled view of a second embodiment of the series fan assembling structure of the present invention.

Please refer to FIG. 3, which is a perspective assembled view of a second embodiment of the series fan assembling structure of the present invention. The second embodiment is substantially identical to the first embodiment in structure and connection relationship and thus will not be repeatedly described hereinafter. The second embodiment is different from the first embodiment in that at least one perforation 111 is formed in each corner of the first open end 11 and at least one perforation 215 is formed in each corner of the third open end 21.

Figure 4:
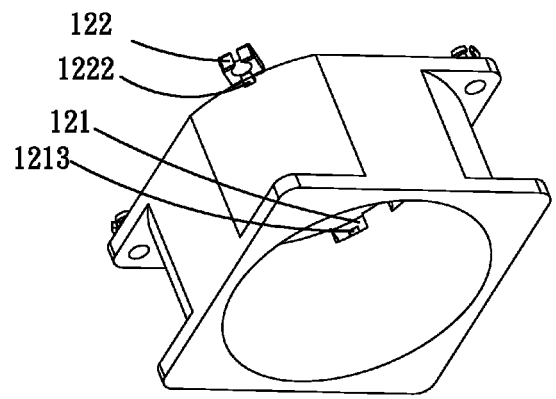
FIG. 4 is a perspective view of the first main body of a third embodiment of the series fan assembling structure of the present invention.
Figure 5:
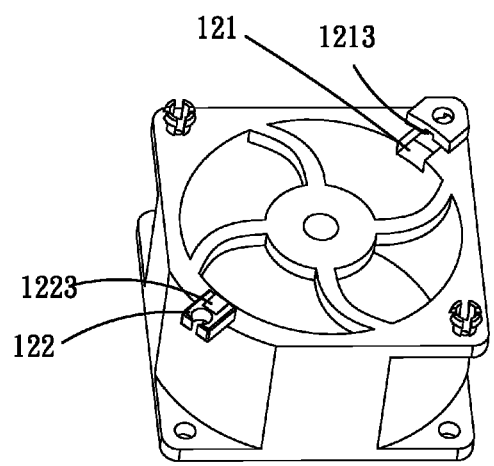
FIG. 5 is a perspective view of the first main body of the third embodiment of the series fan assembling structure of the present invention, seen from another angle.
Figure 6:
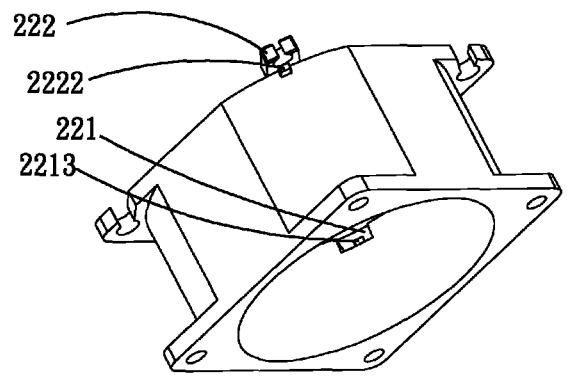
FIG. 6 is a perspective view of the second main body of the third embodiment of the series fan assembling structure of the present invention.
Figure 7:
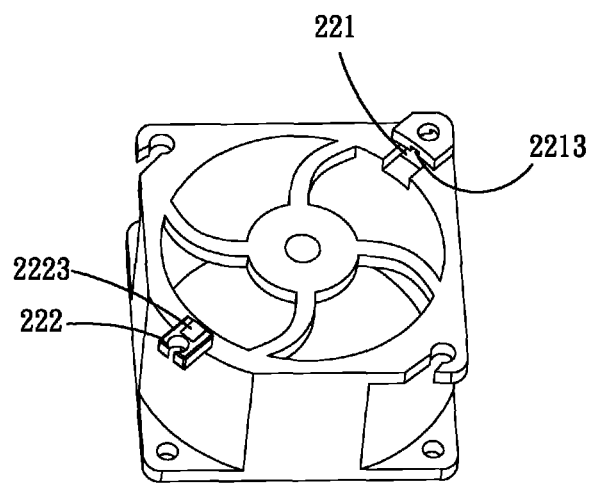
FIG. 7 is a perspective view of the second main body of the third embodiment of the series fan assembling structure of the present invention, seen from another angle.

Please refer to FIGS. 4, 5, 6 and 7. FIG. 4 is a perspective view of the first main body of a third embodiment of the series fan assembling structure of the present invention. FIG. 5 is a perspective view of the first main body of the third embodiment of the series fan assembling structure of the present invention, seen from another angle. FIG. 6 is a perspective view of the second main body of the third embodiment of the series fan assembling structure of the present invention. FIG. 7 is a perspective view of the second main body of the third embodiment of the series fan assembling structure of the present invention, seen from another angle. The third embodiment is substantially identical to the first embodiment in structure and connection relationship and thus will not be repeatedly described hereinafter. The third embodiment is different from the first embodiment in that the first reception recess 121 further has a first locating recess 1213 and the second reception recess 221 has a second locating recess 2213. The first engagement body 122 has a first locating body 1222 corresponding to the second locating recess 2213 and has a first fastening section 1223 on an opposite side. The second engagement body 222 has a second locating body 2222 corresponding to the first locating recess 1213 and has a second fastening section 2223 on an opposite side. The first locating body 1222 is correspondingly inserted into the second locating recess 2213, while the second locating body 2222 is correspondingly inserted into the first locating recess 1213.

The above embodiments are only used to illustrate the present invention, not intended to limit the scope thereof. It is understood that many changes and modifications of the above embodiments can be made without departing from the spirit of the present invention. The scope of the present invention is limited only by the appended claims.

What is claimed is:

1. A series fan assembling structure comprising:
a first main body having a first open end, a second open end and a first flow way in communication with the first and second open ends, in four corners of the second open end being respectively disposed a first reception recess, a first engagement body, a first reception section and a second reception section; and
a second main body having a third open end, a fourth open end and a second flow way in communication with the third and fourth open ends, in four corners of the fourth open end being respectively disposed a second reception recess, a second engagement body, a first raised body and a second raised body, the first and second engagement bodies and the first and second raised bodies being respectively correspondingly latched and engaged with the first and second reception recesses and the first and second reception sections, wherein the first reception recess has a first open side and a first closed side, the second reception recess having a second open side and a second closed side, the first engagement body having a first engagement end, the second engagement body having a second engagement end, the first and second engagement ends abutting against the first and second open sides respectively.

2. The series fan assembling structure as claimed in claim 1, wherein at least one perforation is formed in each corner of the first open end and at least one perforation is formed in each corner of the third open end.

3. The series fan assembling structure as claimed in claim 1, wherein the second open end has a first bushing seat and multiple connection bodies, two ends of the connection bodies being respectively connected to the second open end and the first bushing seat, the fourth open end having a second bushing seat and multiple connection bodies, two ends of the connection bodies being respectively connected to the fourth open end and the second bushing seat, one end of the first bushing seat being mated with the second bushing seat.

4. The series fan assembling structure as claimed in claim 1, wherein the first raised body has a first protrusion end and a first socket axially recessed on the first protrusion end, the second raised body having a second protrusion end and a second socket axially recessed on the second protrusion end.

5. The series fan assembling structure as claimed in claim 1, wherein the first and second raised bodies extend from the fourth open end in a direction away from the fourth open end.

6. The series fan assembling structure as claimed in claim 1, wherein the first and second flow ways communicate with each other.

7. The series fan assembling structure as claimed in claim 1, wherein the first reception recess further has a first locating recess and the second reception recess has a second locating recess, the first engagement body having a first locating body corresponding to the second locating recess and having a first fastening section on an opposite side, the second engagement body having a second locating body corresponding to the first locating recess and having a second fastening section on an opposite side, the first locating body being correspondingly inserted in the second locating recess, while the second locating body being correspondingly inserted in the first locating recess.

\* \* \* \* \*